(12) United States Patent
Shim et al.

(10) Patent No.: US 11,619,678 B2
(45) Date of Patent: Apr. 4, 2023

(54) SYSTEM AND METHOD FOR DETERMINING A CAUSE OF A BATTERY DEFECT

(71) Applicants: HYUNDAI MOTOR COMPANY, Seoul (KR); KIA CORPORATION, Seoul (KR)

(72) Inventors: Jin Yong Shim, Asan-si (KR); Jae Eun Jin, Incheon (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

(21) Appl. No.: 17/505,228

(22) Filed: Oct. 19, 2021

(65) Prior Publication Data

US 2022/0163595 A1    May 26, 2022

(30) Foreign Application Priority Data

Nov. 25, 2020 (KR) .......... 10-2020-0160050

(51) Int. Cl.
*G01R 31/392* (2019.01)
*G01R 31/389* (2019.01)
*G01R 31/36* (2020.01)

(52) U.S. Cl.
CPC ....... *G01R 31/392* (2019.01); *G01R 31/3648* (2013.01); *G01R 31/389* (2019.01)

(58) Field of Classification Search
CPC .................................................. G01R 31/392
USPC ............................................................ 702/63
See application file for complete search history.

(56) References Cited

U.S. PATENT DOCUMENTS

| | | | |
|---|---|---|---|
| 2006/0043975 A1* | 3/2006 | Hart ........................ | H01M 6/36 324/426 |
| 2012/0078552 A1* | 3/2012 | Mingant .............. | G01R 31/367 702/63 |
| 2015/0048838 A1* | 2/2015 | Ose ...................... | G01R 31/389 324/430 |

FOREIGN PATENT DOCUMENTS

| KR | 20120136119 A | 12/2012 |
|---|---|---|
| KR | 20200020566 A | 2/2020 |

* cited by examiner

*Primary Examiner* — Ricky Go
(74) *Attorney, Agent, or Firm* — Lempia Summerfield Katz LLC

(57) ABSTRACT

Disclosed are a system for and a method of determining the cause of a defect of a battery, which is specifically attributable to a human error, through electrochemical impedance spectroscopy (EIS). The system includes an impedance measurement unit for measuring an impedance value of a battery while sequentially applying AC current signals of respective frequencies to the battery, a controller for determining the cause of the defect of the battery on the basis of the measured impedance value, and a table in which each of impedance value ranges is associated with a cause of a defect. The controller determines a cause of a defect of the battery by comparing the measured impedance value and each of the impedance value ranges.

17 Claims, 7 Drawing Sheets

SYSTEM AND METHOD FOR DETERMINING A CAUSE OF A BATTERY DEFECT

CROSS REFERENCE TO RELATED APPLICATION

The present application claims priority to Korean Patent Application No. 10-2020-0160050, filed Nov. 25, 2020, the entire contents of which are incorporated herein for all purposes by this reference.

BACKGROUND

1. Field of the Disclosure

The present disclosure relates to a system for determining a cause of a human error-induced defect of a battery, which occurs during a battery production process, through electrochemical impedance spectroscopy (EIS) and a to method of determining a cause of a defect of a battery using the same.

2. Description of the Related Art

A typical vehicle battery is provided in the form of a 12V module in which six 2V cells are connected in series. Batteries manufactured through the same process and made of the same material must exhibit similar levels in quality and performance. However, it is not rare that batteries that are manufactured in the same lot vary in durability performance (i.e., depth of discharge (DoD)). There is even a case where some batteries among the batteries produced in the same lot do not satisfy the specifications that are required. Measures that are taken to deal with such a problem are mostly focused on temporary short-term measures.

It is assumed that the main cause of variation in the performance of battery products manufactured in the same production lot is irregularities in production conditions during the production process. In this regard, there is a problem in that there is no inspection device and standard to filter out defective batteries that occur due to human errors in the final inspection step. In fact, even though such an error occurs during the production process, there are no criteria to filter out defective batteries.

The quality variation among batteries that are produced through the same production process will result in deterioration in product reliability and life span of the batteries. Therefore, the batteries will cause problems while customers drive their vehicle equipped with such a battery. Therefore, it is necessary to find a method that can select and filter out defective batteries attributable to human errors in prior to shipment of batteries.

SUMMARY

The present disclosure has been made to solve the problems occurring in the related art.

One objective of the present disclosure is to provide a system for determining a cause of a human error-induced defect of a battery, which occurs during a battery production process, through electrochemical impedance spectroscopy (EIS). Another objective of the present disclosure is to provide a method of determining a cause of a defect of a battery using the system.

However, the objectives of the present disclosure are not limited thereto. The objectives of the present disclosure should become more apparent from the following description and should be realized by the means described in the claims and combinations thereof.

One aspect of the present disclosure provides a system for determining a cause of a defect of a battery. The system includes: an impedance measurement unit configured to measure an impedance value by applying an alternating current (AC) signal at a plurality of frequencies to a battery dipped in an electrolyte solution; a controller configured to determine whether the battery is defective on the basis of the measured impedance value; and a table in which each of impedance value ranges is associated with a cause of defect of a battery. The controller determines the cause of the battery defect by comparing the measured impedance value with each of the impedance value ranges included in the table.

The measured impedance value may be an impedance value $Rp$ in a low frequency domain (0.1 to 1.5 Hz).

The causes of the defect of the battery may include one or more errors selected from the group consisting of an error occurring in a formation process and an error occurring in an additive mixing process for a positive/negative electrode.

In the table, an impedance value range of 16 to 20 may represent that the cause of a defective battery is an error in an additive mixing process for a negative electrode. An impedance value range of 30 to 70 may represent that the cause is the defective battery is an error occurring in a formation process. An impedance value range of 80 to 90 may represent that the cause of the defective battery is an error occurring in an additive mixing process for a positive electrode. An impedance value range of 30 to 42 may represent that the cause of the defective battery is an error occurring in an additive mixing process for a positive/negative electrode. An impedance value range of 9 to 11 may represent that the battery is normal.

Another aspect of the present disclosure provides a battery defect diagnosis method. The method includes: dipping a battery including an electrode in an electrolyte solution; measuring an impedance value by applying an alternating current (AC) signal at multiple frequencies with the impedance measurement unit; and determining a cause of a defect of the battery by comparing the impedance value that is measured and each of the impedance value ranges stored in the table.

For example, the measured impedance value is an impedance value $Rp$ in a low frequency domain (0.1 to 1.5 Hz).

The causes of the defect of the battery may include one or more errors selected from the group consisting of an error in a formation process and an error occurring in an additive mixing process for a positive/negative electrode.

When the impedance value $Rp$ measured by the impedance measurement unit is in a range of 16 to 20, the controller determines that the battery is defective due to an error in an additive mixing process for a negative electrode.

When the impedance value $Rp$ measured by the impedance measurement unit is in a range of 30 to 70, the controller determines that the battery is defective due to an error in a formation process (also called a battery activation process).

When the impedance value $Rp$ measured by the impedance measurement unit is in a range of 80 to 90, the controller determines that the battery is defective due to an error in an additive mixing process for a positive electrode.

When the impedance value $Rp$ measured by the impedance measurement unit is in a range of 30 to 42, the controller determines that the battery is defective due to an error in an additive mixing process for a negative/positive electrode.

When the impedance value Rp measured by the impedance measurement unit is in a range of 9 to 11, the controller determines that the battery is not defective.

The system and method of determining a cause of a battery defect through electrochemical impedance spectroscopy (EIS), according to the present disclosure, can be easily applied to existing battery production processes. Therefore, it is not necessary to change or modify an existing production line when using the system and method in the existing production line. Thus, the system and method are cost effective.

In addition, since the system and method according to the present disclosure are based on the impedance values in a low frequency region, which are obtained through electrochemical impedance spectroscopy, the system and method according to the present disclosure have an advantage of more clearly identifying the cause of a human error-induced defect of a battery than conventional systems and methods.

However, the advantages of the present disclosure are not limited thereto. It should be understood that the advantages of the present disclosure include all effects that can be inferred from the following description.

BRIEF DESCRIPTION OF THE DRAWINGS

The above and other objectives, features, and other advantages of the present disclosure should be more clearly understood from the following detailed description taken in conjunction with the accompanying drawings, in which.

DESCRIPTION OF THE DISCLOSED EMBODIMENTS

Figure 1:
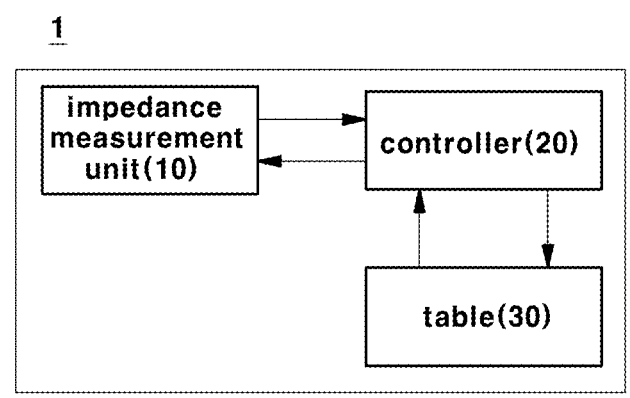
FIG. 1 is a block diagram illustrating the construction of a system for determining a cause of a defective battery, according to one embodiment of the present disclosure.

Above objectives, other objectives, features, and advantages of the present disclosure should be readily understood from the following embodiments associated with the accompanying drawings. However, the present disclosure is not limited to the embodiments described herein and may be embodied in other forms. The embodiments described herein are provided so that the disclosure can be made thorough and complete and that the spirit of the present inventive concept can be fully conveyed to those having ordinary skill in the art.

Throughout the drawings, like elements are denoted by like reference numerals. In the accompanying drawings, the dimensions of the structures may be enlarged greater than actual sizes for clarity of the present disclosure.

It should be further understood that the terms "comprises", "includes", or "has" when used in this specification specify the presence of stated features, regions, integers, steps, operations, elements and/or components, but do not preclude the presence or addition of one or more other features, regions, integers, steps, operations, elements, components and/or combinations thereof. When a component, device, element, or the like of the present disclosure is described as having a purpose or performing an operation, function, or the like, the component, device, or element should be considered herein as being "configured to" meet that purpose or to perform that operation or function.

In this specification, where a range of a variable is described, it should be understood that the variable includes all values within the stated range, including the stated endpoints of the range. For example, a range of 5 to 10 includes: integer values such as 5, 6, 7, 8, 9, and 10; any sub-ranges such as 6 to 10, 7 to 10, 6 to 9, 7 to 9, and the like; and any values between integers such as 5.5, 6.5, 7.5, 5.5 to 8.5 and 6.5 to 9, and the like. For example, a range of 10% to 30% includes: any integer percentages such as 10%, 11%, 12%, 13%, and the like, inclusive of 30%; any sub ranges such as 10% to 15%, 12% to 18%, 20% to 30%, and the like; and any non-integer percentages between integer percentages such as 10.5%, 15.5%, 25.5%, and the like.

Conventionally, the performance of a battery produced by a battery manufacturer needs to be verified. For this, a method of measuring the internal resistance of each cell is used to specifically check whether the battery is normally assembled. In addition, a method of applying a high current to a battery and detecting a micro-shortage in the battery is used. However, the methods have a problem in that it is not possible to sort out defective batteries attributable to human errors in a production process. In other words, for batteries that are normally shipped from battery manufacturers and received by automakers, the automakers perform various verification processes such as evaluation of capacity and dark current of the batteries. However, there was a problem in that it was not possible to determine the cause of defects of batteries, which are attributable to human errors, through all of the verification procedures.

The inventors of the present disclosure have found that it is possible to determine the causes of human error-induced defects of batteries on the basis of low frequency-domain impedance values obtained through impedance spectroscopy and have reached the present inventive concept in which a new verification technology different from the existing verification technologies is used to determine the causes of defects of batteries, which are attributable to human errors during a battery production process.

Hereinafter, a method and system for determining the cause of defects of batteries through impedance spectroscopy, according to one embodiment of the present disclosure, is described with reference to the accompanying drawings.

FIG. 1 is a block diagram illustrating the construction of a system for determining the cause of a defect of a battery, according to one embodiment of the present disclosure.

Referring to FIG. 1, a battery defect screening system 1 includes: an impedance measurement unit 10 configured to measure an impedance value of a battery by applying an alternating current signal at multiple frequencies to the battery dipped in an electrolyte solution; a controller 20 configured to determine whether the battery is defective on the basis of the measured impedance value; and a table 30 in which each of impedance value ranges is associated with a cause of a battery defect. The controller 20 determines the cause of the defect of the battery by comparing the measured impedance value with each of the impedance value ranges included in the table.

The impedance measurement unit 10 applies alternating current signals of various frequencies to a battery dipped in an electrolyte solution and measures the impedance value of the battery for each alternating current signal.

The battery includes an electrode. Specifically, the battery includes a first electrode, a second electrode, and a separator. The first electrode includes a first current collector and a first layer formed on the first current collector. The second electrode includes a second current collector and a second layer formed on the second current collector. In this case, the first electrode and the second electrode are the same or different in polarity. When the first electrode and the second electrode are the same in polarity, respective coating layers of the first and second electrodes are made of the same material. When the first electrode and the second electrode differ in polarity, the respective coating layers of the first and second electrodes are made of different materials. The separator is combined with a reference electrode (not illustrated). The battery may be a lead-acid battery including the electrode described above.

The amplitude of the AC current signal, i.e., the magnitude of the AC current, is appropriately set in consideration of the magnitude of the charge/discharge current of the battery. For example, the magnitude of the AC current is set to be in a range of 1 μA to 1 A.

Figure 2:
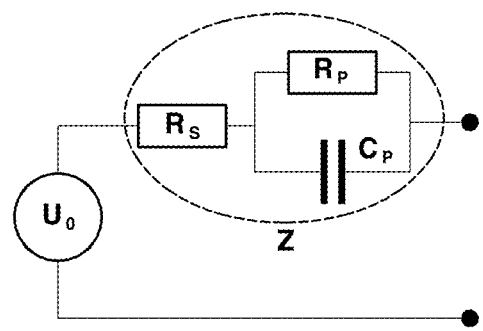
FIG. 2 is a circuitry diagram illustrating an impedance model of an impedance measurement unit.

FIG. 2 is a circuitry diagram illustrating an impedance model of an impedance measurement unit. Referring to FIG. 2, Rs refers to the solution resistance (Ohm resistance) of the electrolyte, Rp refers to the internal electrochemical reaction rate (electrode/solution interface resistance), and Cp refers to the capacitance of the electric double layer between the electrode and the electrolyte and indicates the state of charge (SoC) of the battery.

The impedance measurement unit 10 measures the impedance of the battery through electrochemical impedance spectroscopy (EIS) under a plurality of frequencies preset according to the impedance model, thereby obtaining information related to the internal state of the battery.

Figure 3:
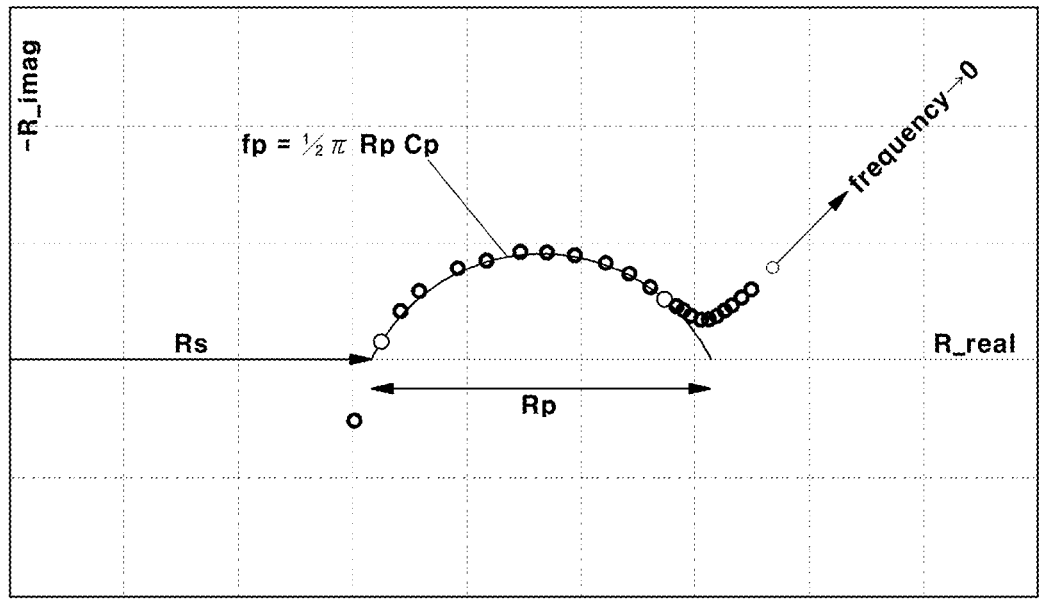
FIG. 3 is a Nyquist plot for impedance values measured by the impedance measurement unit.

FIG. 3 is a Nyquist plot for impedance values measured by the impedance measurement unit. Referring to FIG. 3, the x-coordinate of each plotted point corresponds to the real part of an impedance value, and the y-coordinate corresponds to the imaginary part of the impedance value. In FIG. 3, Rs refers to the solution resistance (Ohm resistance) of the electrolyte, and Rp refers to the internal electrochemical reaction rate (electrode/solution interface resistance) of the electrolyte.

Differently from the existing technology, the present inventive concept determines the cause of a human error-induced defect of a battery on the basis of the impedance values Rp obtained at low frequencies in a frequency range of 0.1 to 1.5 Hz among the measured impedance values. The impedance value at a low frequency in such a frequency range represents the electrochemical reaction rate in the battery.

The impedance measurement unit 10 is connected to the controller 20 through a communication cable (not shown).

The controller 20 determines whether the battery is defective on the basis of the measured impedance value.

A memory device storing the table 30 in which the causes of defects of batteries are listed and the controller unit 20 may be connected to each other through a communication cable (not shown), or the table 30 is stored in the controller 20 so that the controller 20 can determine the cause of defects of batteries. In the table 30, impedance values are divided into a plurality of ranges, and the causes of battery failure are associated with respective impedance value ranges. The controller determines the cause of a battery failure by comparing the measured impedance value and the impedance values included in the table.

The cause of battery failure may be a human error occurring in a battery production process. Specifically, the cause may be a human error occurring in a battery formation process (activation) and/or a human error occurring in an additive mixing process for a positive/negative electrode. The human errors are not limited to specific errors but include errors that can be identified on the basis of impedance values obtained at a low frequency range of 0.1 to 1.5 Hz.

In other words, the inventors who have completed the present inventive concept have found the fact that different impedance values are detected respectively when a human error occurs in a battery formation process and a human error occurs in an additive mixing process for a positive/negative electrode.

For example, an error in a battery formation process means an error in battery charging conditions. Specifically, it means that the amount of battery charge is greater or less than a set value. Normal batteries exhibit impedance values Rp in a range of 9 to 11. Batteries that are charged in the amount greater than the set value also exhibit the same range of impedance values Rp. It means that the batteries are sufficiently activated. However, when the amount of charge in a certain battery is less than the amount of charge in a normal battery, it means that the battery has an activated region. The inactive region in the battery acts as a resistor. Therefore, the battery performance of such a battery differs from that of normal batteries. In other words, when the amount of charge is insufficient, the impedance value Rp is high because the resistance increases due to the inactive region serving as a resistor. Therefore, as the amount of charge in a battery decreases, the impedance value Rp of the battery increases. In other words, the amount of charge is in inverse proportional to the impedance value Rp. Accordingly, when the amount of charge is 15% less than the normal amount of charge, the measured impedance value Rp is in a range of 30 to 42. On the other hand, when the amount of charge is insufficient by 30% compared to the normal amount of charge, the measured impedance value Rp is in a range of 55 to 70. As the amount of charge decreases, the internal resistance increases due to the inactive region, and the overall battery performance decreases.

Examples of the error in the additive mixing process for a positive/negative electrode include a case where the amount of an additive for a positive electrode is excessive, a case where the amount of an additive for a positive electrode is insufficient, a case where the amount of an additive for a negative electrode is excessive, a case where the amount of an additive for a negative electrode is insufficient, a case where both of the additives for positive and negative electrodes are excessive, and a case where both of the additives for positive and negative electrodes are insufficient.

When the additive for a positive electrode is insufficient or excessive, the impedance value Rp significantly increases to a range of 80 to 90. When the additive for a positive electrode is insufficiently added, the activity decreases and the resistance increases. On the other hand, and when the additive for a positive electrode is excessively added, the ratio of a by-product $Pb_2O_3$ to a main product $PbO_2$ increases, resulting in an increase in the resistance. The additive for a positive electrode is, for example, red lead ($Pb_3O_4$).

When the additive for a negative electrode is insufficient or excessive, the impedance value Rp is in a range of 16 to 20. When the additive for a negative electrode is insufficiently added, the activity of the negative electrode decreases, resulting in an increase in resistance. Conversely, when the additive for a negative electrode is excessively added, the reaction rate is excessively increased by carbon having excellent electrical conductivity, resulting in an increase in heat generation and an increase in resistance due to a reduction in the amount of electrolyte. The additive for a negative electrode is, for example, a carbon-based organic compound (lignin).

When both of the additives for positive and negative electrodes are insufficiently or excessively added, an increase in resistance due to an error in an additive for a positive electrode and an increase in resistance due to an error in an additive for a negative electrode are partially offset. Therefore, the impedance value measured in this case is in an intermediate range between the impedance value range measured in a case where the additive for a positive electrode is excessively or insufficiently added and a case where the additive for a negative electrode is excessively or insufficiently added.

As such, the inventors have compared the low-frequency impedance data of defective batteries manufactured through a production process in which possible human errors occur in the battery production process with the impedance data of normal batteries manufactured through an error-free production process. The inventors have found that the measured impedance values Rp differ between normal batteries and defective batteries and that the causes of defects of defective batteries are identifiable on the basis of the impedance value ranges.

Accordingly, the cause determining system for a battery failure, according to the present disclosure, can determine the cause of a defect of a battery by using a table in which various causes of defects are associated with respective impedance value ranges. For example, the table includes the impedance value ranges described below. In the table, an impedance value range of 16 to 20 represents that the cause of a defect of the tested battery is an error in an additive mixing process for a negative electrode. An impedance value range of 30 to 70 represents that the cause of a defect of the tested battery is an error occurring in a formation process. An impedance value range of 80 to 90 represents that the cause of a defect of the tested battery is an error occurring in an additive mixing process for a positive electrode. An impedance value range of 30 to 42 represents that the cause of a defect of the tested battery is errors occurring in both of the positive and negative additive mixing processes. An impedance value range of 9 to 11 represents that the tested battery is normal.

Accordingly, the system according to the present disclosure has an advantage of being capable of identifying the cause of a defect of a battery by grouping impedance values into multiple ranges, storing a table in which the impedance value ranges are associated with respective causes of defects, comparing the measured impedance value of a tested battery with the impedance values in the table, and determining the cause of the defect of the tested battery.

In other words, since the system according to the present disclosure can relatively simply identify the cause of a battery defect attributable due to a human error, the system can be easily applied to an existing battery production line without modifying the existing battery production line. Therefore, the system can be cost-effectively used.

Figure 4:
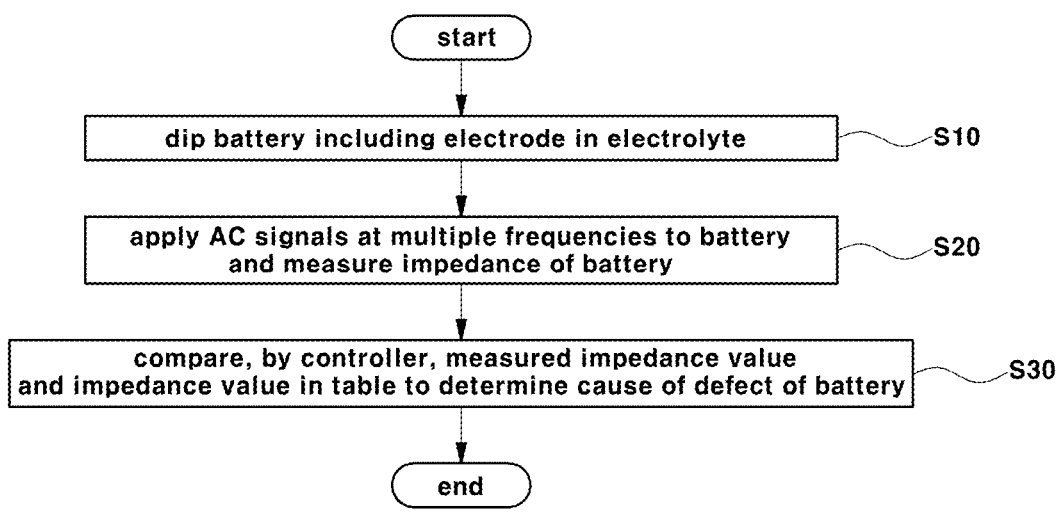
FIG. 4 is a flowchart illustrating a method of determining a cause of a defective battery using the system according to one embodiment of the present disclosure.

FIG. 4 is a flowchart illustrating a method of determining a cause of a defective battery using the system according to one embodiment of the present disclosure. The method includes: dipping a battery including an electrode in an electrolyte solution (step S10); measuring an impedance value by sequentially applying alternating current (AC) signals at multiple frequencies with the impedance measurement unit (step S20); and determining a cause of a defect of the battery by comparing the impedance value that is measured and each of the impedance value ranges stored in the table (step S30).

The step S10 of dipping the battery in the electrolyte solution and the step S20 of measuring the impedance value are performed specifically in a manner in which a battery including an electrode is dipped in an electrolyte solution, alternating current signals at multiple frequencies are sequentially applied to the battery, and an impedance value Rp is measured while applying an AC signal in a low frequency range of 0.1 to 1.5 Hz to the battery. The measured impedance value measured under the same condition represents the electrochemical reaction rate in the battery.

In the step S30 of determining the case of a defect of a battery, the controller compares the measured impedance value with each of the impedance values in the table, thereby determining the cause of the defect.

The cause of a battery defect may be a human error occurring in the battery production process. Specifically, the cause may be a human error occurring in a battery formation process, an additive mixing process for a positive electrode, an additive mixing process for a negative electrode, or additive mixing processes for positive and negative electrodes.

In other words, the controller compares the impedance value measured by the impedance measurement unit with the impedance values stored in the table, determines to which impedance value range the measured impedance value belongs, and determines the cause of a defect, which is associated with the impedance value range in which the measured impedance range is include within the table.

Specifically, when the impedance value Rp measured by the impedance measurement unit is in a range of 16 to 20, the controller determines that the battery is defective due to an error that has occurred in an additive mixing process for a negative electrode. When the impedance value Rp measured by the impedance measurement unit is in a range of 30 to 70, the controller determines that the battery is defective due to an error that has occurred in a formation process. When the impedance value Rp measured by the impedance measuring unit is in a range of 80 to 90, the controller determines that the battery is defective due to an error that has occurred in an additive mixing process for a positive electrode. When the impedance value Rp measured by the impedance measurement unit is in a range of 30 to 42, the controller determines that the battery is defective due to errors that have occurred in additive mixing processes for negative and positive electrodes. When the impedance value Rp measured by the impedance measurement unit is in a range of 9 to 11, the controller determines that the battery is not defective.

In other words, the method of determining the cause of a battery failure, according to the present disclosure, uses the impedance values Rp measured at a low frequency (in a range of 0.1 to 1.5 Hz) among several impedance values to quickly and easily determine the cause of a human error-induced defect that occurs during the battery production process.

The present inventive concept is described in more detail with reference to examples described below. The examples described below are presented only to help enhance understanding of the present inventive concept, and the scope of the present disclosure is not limited thereto.

Example 1: Preparation of Normal Battery Sample

A normal battery was manufactured through a method described below.

A positive active material and a negative active material were coated on respective substrates to form a positive electrode plate and a negative electrode plate, respectively. The positive electrode plate and the negative electrode plate were assembled to form a cell. Six cells produced in the same way were connected in series to form a 12V battery. Next, electrolyte (sulfuric acid) was injected into the 12V battery to activate the positive and negative active materials. Through this step, the battery entered into an operable state. This formation process involved 10 to 14 charging and discharging cycles that vary depending on manufacturers. When this formation process was performed according to a normal profile, the produced batteries exhibited the designed performance.

Examples 2-10: Preparation of Defective Battery Samples

The following defective battery examples are in comparison with Example 1.

Example 2 is a battery sample that was manufactured through a production process in which one charge and discharge cycle is less than the required number of charge and discharge cycles according to a normal profile in a formation process.

Example 3 is a battery sample that was manufactured through a production process in which two charge and discharge cycles are less than the required number of charge and discharge cycles according to a normal profile in a formation process.

Example 4 is a battery sample that was manufactured through a production process in which the amount of charge is less than that of an AGM80 Ah type in a formation process.

Example 5 is a battery sample that was manufactured through a production process in which a mixing ratio of an additive for a positive electrode is excessive.

Example 6 is a battery sample that was manufactured through a production process in which a mixing ratio of an additive for a positive electrode is insufficient.

Example 7 is a battery sample that was manufactured through a production process in which a mixing ratio of an additive for a negative electrode is excessive.

Example 8 is a battery sample that was manufactured through a production process in which a mixing ratio of an additive for a negative electrode is insufficient.

Example 9 is a battery sample that was manufactured through a production process in which mixing ratios of additives for positive and negative electrodes are excessive.

Example 10 is a battery sample that was manufactured through a production process in which mixing ratios of additives for positive and negative electrodes are insufficient.

Test Example 1: Evaluation of Basic Performance of Battery Samples

Figure 5:
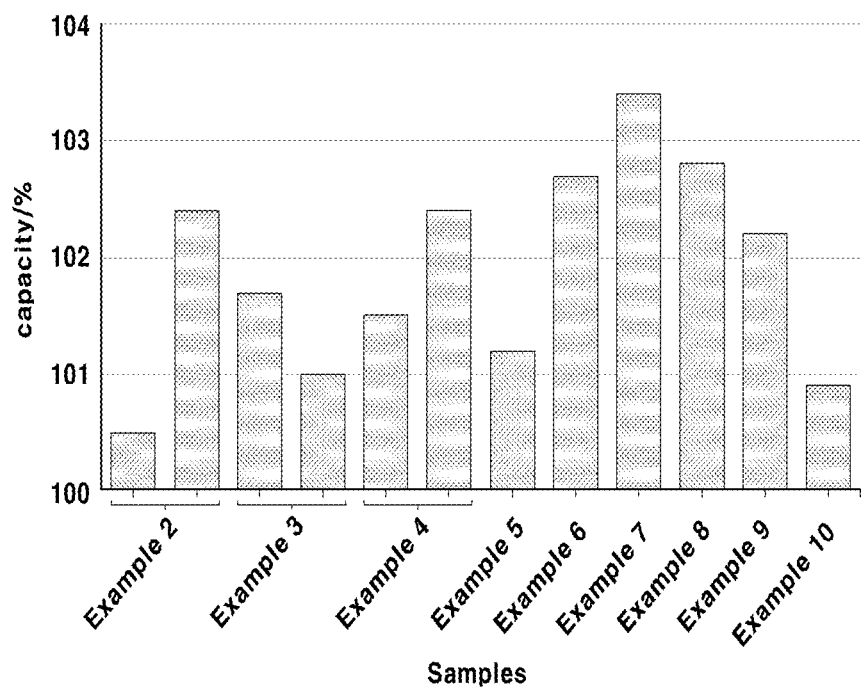
FIG. 5 is a graph illustrating a reserve capacity of a battery according to each of Examples 2 to 10.
Figure 6:
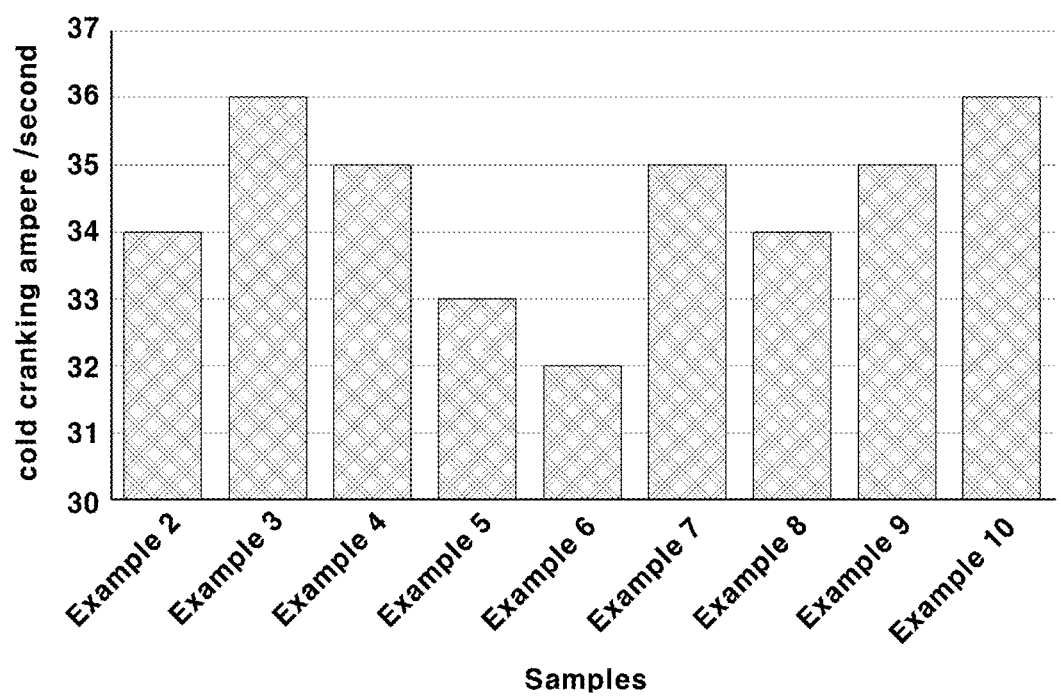
FIG. 6 is a graph illustrating a result of evaluation of a cold cranking ampere of a battery sample according to each of Examples 2 to 10.

Battery Samples (Examples 2 to 10) were prepared, and the reserve capacity and cold cranking ampere (basic performances) of each battery sample were measured and illustrated in FIGS. 5 and 6.

FIG. 5 is a graph illustrating a reserve capacity of a battery according to each of Examples 2 to 10. Referring to FIG. 5, the evaluation of the reserve capacity is performed by measuring the state of charge while discharging the battery sample at a predetermined current. The evaluation results show that all of the battery samples (Examples 2 to 10) exhibited 100% or more as the reserve capacity. This means that all of the battery samples satisfy the criteria for "pass".

FIG. 6 is a graph illustrating a result of evaluation of a cold cranking ampere of a battery sample according to each of Examples 2 to 10. Referring to FIG. 6, the evaluation of the cold cranking ampere is performed by measuring a time it takes for a voltage to reach 7.2 V when a high current of 760 A is applied to each battery sample in a low-temperature (−18° C.) environment. The evaluation results show that all of the battery samples (Examples 2 to 10) exhibited 30 seconds or more which satisfy a reference time for pass.

In other words, the results of the basic performance evaluation showed that the battery samples according to Examples 2 to 10, which were produced through a method in which a human error occurred passed all of the pass criteria as well as the normal battery sample according to Example 1. This means it is impossible to distinguish normal batteries and defective batteries through the basic performance evaluation.

Test Example 2: Evaluation of Durability Performance of Battery Samples

Battery samples according to Examples 1 to 10 were prepared and durability performance (depth of durability (DoD)) of each battery sample was measured. The evaluation results are shown in FIG. 7.

Figure 7:
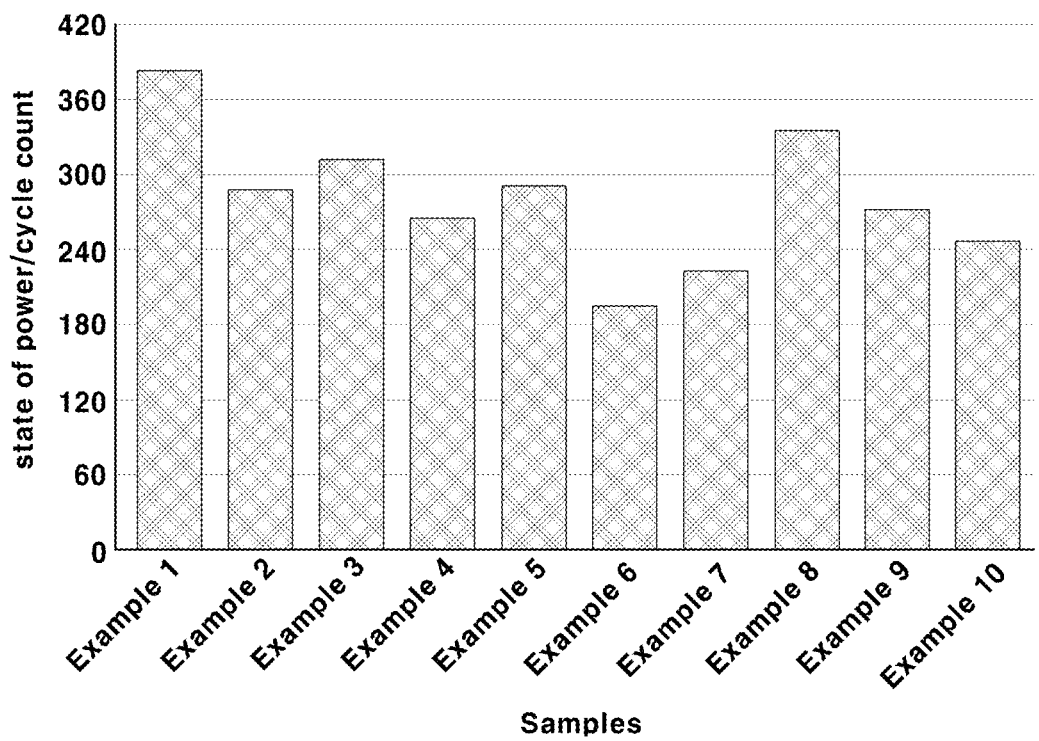
FIG. 7 is a graph illustrating a result of depth-of-discharge (DOD) 50% test for a battery sample according to each of Examples 1 to 10.

FIG. 7 is a graph illustrating a result of a depth-of-discharge (DOD) 50% test for a battery sample according to each of Examples 1 to 10. Referring to FIG. 7, the durability performance evaluation is an evaluation method that simulates a state in which each battery sample is discharged to a predetermined depth (for example, 50% of nominal capacity) and is charged to 100% of the nominal capacity. In the test, each battery sample is repeatedly discharged and charged. As the results of the durability performance evaluation, among the battery samples according to Examples 1 to 10, the normal battery sample according to Example 1 showed a durability life of 384 cycles, while all of the defective batteries according to Examples 2 to 10 showed a durability life shorter than 360 cycles (reference cycle count for pass). However, it was confirmed that the number of cycles of each of the defective batteries according to Examples 2 to 10 was not regular. Therefore, it was difficult to determine the cause of the defective battery on the basis of the number of charge and discharge cycles.

In other words, it was confirmed that the battery samples according to Examples 2 to 10, which may be defective due to a human error occurring in the production process, could not pass the criterion of 360 cycles. However, it was also found that it is impossible to identify the cause of a defect of each battery on the basis of the number of charge and discharge cycles.

Test Example 3: Evaluation Through Comparison of Impedance Values of Battery Samples Battery samples according to Examples 1 to 10 were prepared, and impedance values of the battery samples were measured. The measurement results are shown in FIGS. 8 and 9.

Figure 8:
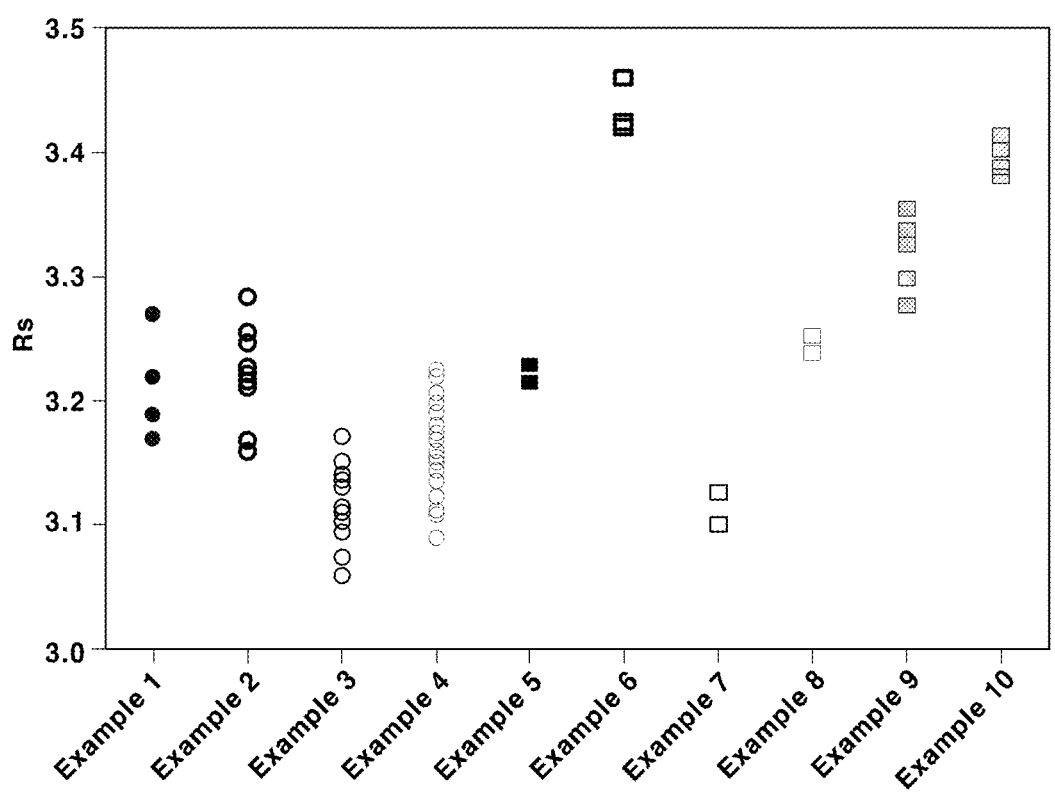
FIG. 8 is an impedance versus resistance graph in a high frequency domain (0.8 to 1.4 kHz) for a battery sample according to each of Examples 1 to 10.

FIG. 8 is an impedance-versus-resistance graph in a high frequency domain (0.8 to 1.4 kHz) for a battery sample according to each of Examples 1 to 10.

Referring to FIG. 8, the resistance value Rs of the battery sample of Example 1 (normal battery) and the resistance values of the battery samples of Examples 2 to 10 (defective batteries) are distributed within a range of 3.0 to 3.5. In other words, it was confirmed that it was not easy to distinguish the battery samples from each other on the basis of the resistance values Rs because the resistance values Rs of some of the battery samples overlap or the scale of the resistance value Rs was small.

Figure 9:
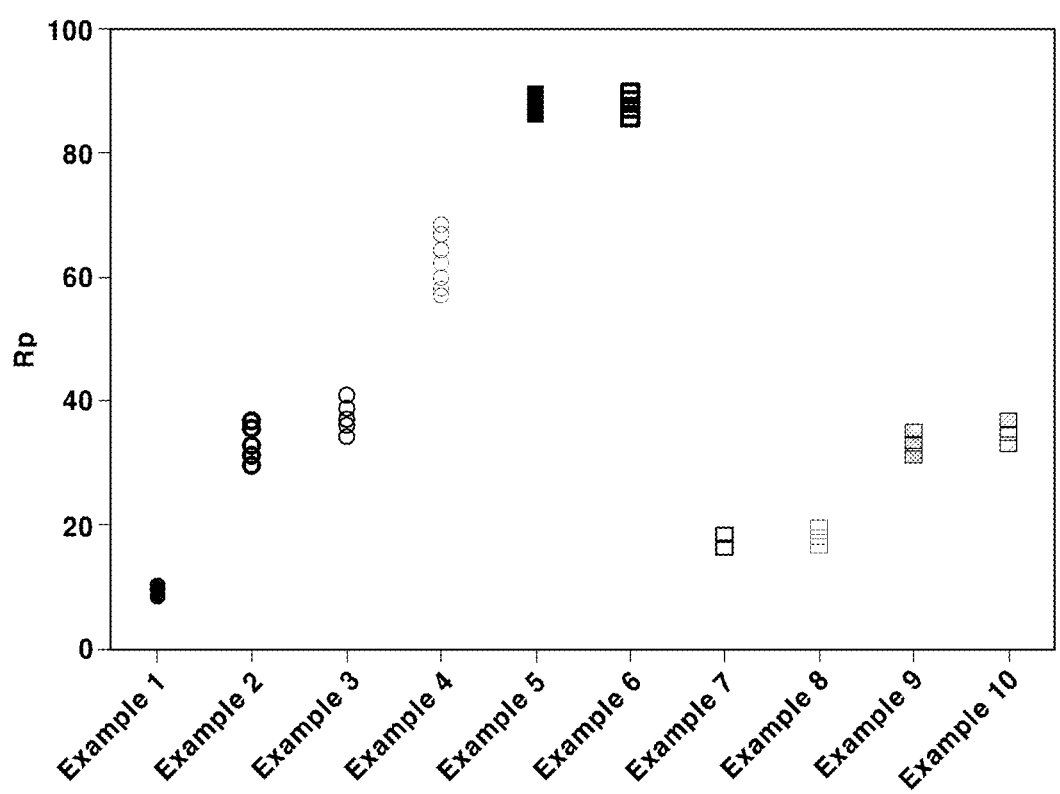
FIG. 9 is an impedance graph representing an electrochemical reaction rate in a low frequency domain (0.1 to 1.5 Hz) in a battery sample according to each of Examples 1 to 10.

FIG. 9 is an impedance graph representing an electrochemical reaction rate in a low frequency domain (0.1 to 1.5 Hz) in a battery sample according to each of Examples 1 to 10.

Referring to FIG. 9, it was confirmed that the result values of the respective battery samples were significant to distinguish among the samples. In particular, the distribution of the impedance values Rp of the defective batteries according to Examples 2 to 10 was clearly shown. In other words, it is possible to distinguish the normal battery sample from the defective battery samples on the basis of the impedance values Rp and to identify the cause of the defect of each of the defective battery samples.

Specifically, an impedance value range of 16 to 20 represents that the cause of a defect of the tested battery is an error in an additive mixing process for a negative electrode. An impedance value range of 30 to 70 represents that the cause of a defect of the tested battery is an error occurring in a formation process. An impedance value range of 80 to 90 represents that the cause of a defect of the tested battery is an error occurring in an additive mixing process for a positive electrode. An impedance value range of 30 to 42 represents that the cause of a defect of the tested battery is errors occurring in both of the positive and negative additive mixing processes. An impedance value range of 9 to 11 represents that the tested battery is normal.

The impedance values are grouped into multiple value ranges on the basis of the results obtained through the tests. A table in which the possible causes of defects are associated with the respective impedance value ranges is stored in the cause determining system according to the present disclosure. The controller of the system compares the impedance value of a tested battery with the impedance values stored in the table and finds the impedance value range to which the measured impedance value belongs. In this way, it is possible to determine the cause of a defective battery.

Although the embodiments of the present disclosure have been disclosed for illustrative purposes, those having ordinary skill in the art should appreciate that various modifications, additions, and substitutions are possible without departing from the scope and spirit of the inventive concept as disclosed in the accompanying claims.

What is claimed is:

1. A system for determining a cause of a defect of a battery, the system comprising:
   an impedance measurement unit configured to measure an impedance value of a battery while sequentially applying AC current signals of respective frequencies to the battery;
   a controller configured to determine a cause of a defect on the basis of the impedance value measured; and
   a table in which each of impedance value ranges is associated with respective causes of defects,
   wherein the controller determines a cause of a defect of the battery by comparing the measured impedance value and each of the impedance value ranges, and
   wherein the cause of the defect of the battery is an error selected from the group consisting of an error occurring in a formation process and an error occurring in an additive mixing process for a positive/negative electrode.

2. The system according to claim 1, wherein the measured impedance value is an impedance value Rp measured when a low frequency (0.1 to 1.5 Hz) AC current signal is applied.

3. The system according to claim 1, wherein, among the impedance value ranges included in the table, an impedance value range of 16 to 20 represents that the cause of the defect of the battery is an error occurring in an additive mixing process for a negative electrode, an impedance value range of 30 to 70 represents that the cause of the defect of the battery is an error occurring in a battery formation process, an impedance value range of 80 to 90 represents that the cause of the defect of the battery is an error occurring in an additive mixing process for a positive electrode, an impedance value range of 30 to 42 represents that the cause of the defect of the battery is an error occurring in an additive mixing process for a positive/negative electrode, and an impedance value range of 9 to 11 represents that the battery is normal.

4. A method of determining a cause of a defect of a battery using the system according to claim 1, the method comprising:
   dipping a battery including an electrode in an electrolyte solution; and
   measuring an impedance value of the battery while sequentially applying AC signals of various frequencies to the battery with the impedance measurement unit.

5. The method according to claim 4, wherein the measured impedance value is an impedance value measured when a low frequency (0.1 to 1.5 Hz) AC signal is applied to the battery.

6. The method according to claim 4, wherein the controller determines that the cause of the defect of the battery is an error occurring in an additive mixing process for a negative electrode when the impedance value measured by the impedance measurement unit is in a range of 16 to 20.

7. The method according to claim 4, wherein the controller determines that the cause of the defect of the battery is an error occurring in a battery formation process when the impedance value measured by the impedance measurement unit is in a range of 30 to 70.

8. The method according to claim 4, wherein the controller determines that the cause of the defect of the battery is an error occurring in an additive mixing process for a positive electrode when the impedance value measured by the impedance measurement unit is in a range of 80 to 90.

9. The method according to claim 4, wherein the controller determines that the cause of the defect of the battery is an error occurring in an additive mixing process for a positive/negative electrode when the impedance value measured by the impedance measurement unit is in a range of 30 to 42.

10. The method according to claim 4, wherein, when the impedance value measured by the impedance measurement unit is in a range of 9 to 11, the controller determines that the battery is not defective.

11. A method of determining a cause of a defect of a battery using a system that includes
an impedance measurement unit configured to measure an impedance value of a battery while sequentially applying AC current signals of respective frequencies to the battery,
a controller configured to determine a cause of a defect on the basis of the impedance value measured, and
a table in which each of impedance value ranges is associated with respective causes of defects, the method comprising:
dipping a battery including an electrode in an electrolyte solution;
measuring an impedance value of the battery while sequentially applying AC signals of various frequencies to the battery with the impedance measurement unit; and
determining, by the controller, a cause of a defect of the battery by comparing the measured impedance value and each of the impedance value ranges.

12. The method according to claim 11, wherein the measured impedance value is an impedance value measured when a low frequency (0.1 to 1.5 Hz) AC signal is applied to the battery.

13. The method according to claim 11, wherein the controller determines that the cause of the defect of the battery is an error occurring in an additive mixing process for a negative electrode when the impedance value measured by the impedance measurement unit is in a range of 16 to 20.

14. The method according to claim 11, wherein the controller determines that the cause of the defect of the battery is an error occurring in a battery formation process when the impedance value measured by the impedance measurement unit is in a range of 30 to 70.

15. The method according to claim 11, wherein the controller determines that the cause of the defect of the battery is an error occurring in an additive mixing process for a positive electrode when the impedance value measured by the impedance measurement unit is in a range of 80 to 90.

16. The method according to claim 11, wherein the controller determines that the cause of the defect of the battery is an error occurring in an additive mixing process for a positive/negative electrode when the impedance value measured by the impedance measurement unit is in a range of 30 to 42.

17. The method according to claim 11, wherein, when the impedance value measured by the impedance measurement unit is in a range of 9 to 11, the controller determines that the battery is not defective.

\* \* \* \* \*